(12) United States Patent
Zhang et al.

(10) Patent No.: US 7,550,667 B2
(45) Date of Patent: Jun. 23, 2009

(54) CASE STRUCTURE FOR ELECTRONIC DEVICE

(75) Inventors: Xin-Yu Zhang, Taipei (TW); Tien-Chang Lin, Taipei (TW)

(73) Assignee: Inventec Corporation, Taipei (TW)

( * ) Notice: Subject to any disclaimer, the term of this patent is extended or adjusted under 35 U.S.C. 154(b) by 523 days.

(21) Appl. No.: 11/303,348

(22) Filed: Dec. 16, 2005

(65) Prior Publication Data

US 2007/0144758 A1    Jun. 28, 2007

(51) Int. Cl.
H02G 3/08    (2006.01)

(52) U.S. Cl. .................. 174/50; 174/17 R; 174/520; 174/559; 220/3.2; 220/3.3; 361/683

(58) Field of Classification Search .................. 174/50, 174/53, 57, 58, 17 R, 521, 559, 560, 59; 220/3.2–3.9, 220/4.02; 361/600, 601, 683, 724, 730, 752; 439/76.1, 76.2, 535
See application file for complete search history.

(56) References Cited

U.S. PATENT DOCUMENTS

| | | | | |
|---|---|---|---|---|
| 4,712,157 A | * | 12/1987 | Simonson et al. | 174/58 |
| 5,770,817 A | * | 6/1998 | Lo | 174/57 |
| 5,907,127 A | * | 5/1999 | Daoud | 174/57 |
| 6,121,548 A | * | 9/2000 | Matsuoka | 174/59 |
| 6,527,302 B1 | * | 3/2003 | Gault et al. | 174/50 |
| 6,541,700 B2 | * | 4/2003 | Chiriku et al. | 174/50 |
| 6,677,519 B2 | * | 1/2004 | Rumsey et al. | 174/50 |
| 6,806,426 B1 | * | 10/2004 | Gretz | 174/57 |
| 7,381,907 B1 | * | 6/2008 | Frusco | 174/50 |

* cited by examiner

Primary Examiner—Angel R Estrada
(74) Attorney, Agent, or Firm—Peter F. Corless; Steven M. Jensen; Edwards Angell Palmer & Dodge LLP

(57) ABSTRACT

A case structure for an electronic device of the present invention at least includes a main body and at least one side piece detachably mounted to at least one side of the main body such that different sizes of case structures could be manufactured only by changing the size of the side piece while keeping the main body unchanged, thereby reducing molding cost for developing new electronic devices, saving a large amount of time needed to design, test and modify cases as well as saving human resources and reducing the manufacturing cost.

6 Claims, 3 Drawing Sheets

CASE STRUCTURE FOR ELECTRONIC DEVICE

FIELD OF THE INVENTION

The present invention relates to case structures for electronic devices, and more particularly to a case structure for receiving main components of an electronic device.

BACKGROUND OF THE INVENTION

Currently, notebook computers on the market are usually provided with a 14.1- or 15-inch display. However, with the trend towards both portability and better visual effect, notebook computer manufacturers are developing diversified types of notebook computers to meet different demands of people. For a newly developed type of notebook computer, a new case structure usually needs to be designed and a new molding process is needed, which results in high manufacturing cost and a time-consuming manufacturing process.

Accordingly, there is a need to develop a case structure for an electronic device which only needs to be partially changed to meet a new design.

SUMMARY OF THE INVENTION

According to the above defects, a primary objective of the present invention is to provide a case structure for an electronic device which only needs to be partially changed to meet a new design, thereby decreasing the manufacturing cost and shortening the manufacturing time.

To achieve the above and other objectives, a case structure for an electronic device of the present invention at least comprises a main body and at least one side piece detachably mounted to at least one side of the main body such that different sizes of case structures for an electronic device could be manufactured only by changing the size of the side piece while keeping the main body unchanged.

The main body comprises an upper case and a lower case. Preferably, the cross section of the main body is trapezoid-shaped.

A recess is formed at one side of the upper case to receive the side piece. The main body has a first mounting portion formed at a predefined position on the recess and the side piece has a second mounting portion formed corresponding to the first mounting portion, the side piece being stably mounted to the main body by engaging the first mounting portion with the second mounting portion.

The first mounting portion includes at least one perforation and slot and the corresponding second mounting portion includes at least one tenon and hook. Alternatively, the first mounting portion could include at least one tenon and hook and the second mounting portion could include at least one perforation and slot.

In addition, the first mounting portion comprises at least one rail groove disposed on the main body and extending along the longitudinal direction of the recess in order to engage at least one protruding rail disposed on the side piece corresponding to the position of the rail groove. Alternatively, the first mounting portion comprises at least one protruding rail to engage at least one rail groove formed on the side piece corresponding to the position of the protruding rail.

Except the side that functions as a rotation axis, the side piece could be mounted to any other side of the main body and the side piece could be made of Al alloy, metal or plastic material.

Therefore, the present invention could provide different sizes of electronic devices by changing the size of the side piece while keeping the main body unchanged, thereby reducing molding cost for developing new electronic devices, saving a large amount of time needed to design, test and modify cases as well as saving human resources and reducing the manufacturing cost.

DETAILED DESCRIPTION OF PREFERRED EMBODIMENTS

Hereunder, embodiments of the present invention will be described in detail with reference to the accompanying drawings.

In the following embodiments, the electronic device of the present invention refers to a notebook computer, but it is not limited thereto. Those skilled in the art will understand that the electronic device could also be a PDA (Personal Digital Assistant), a game player, a palmtop computer or a mobile phone.

Figure 1:
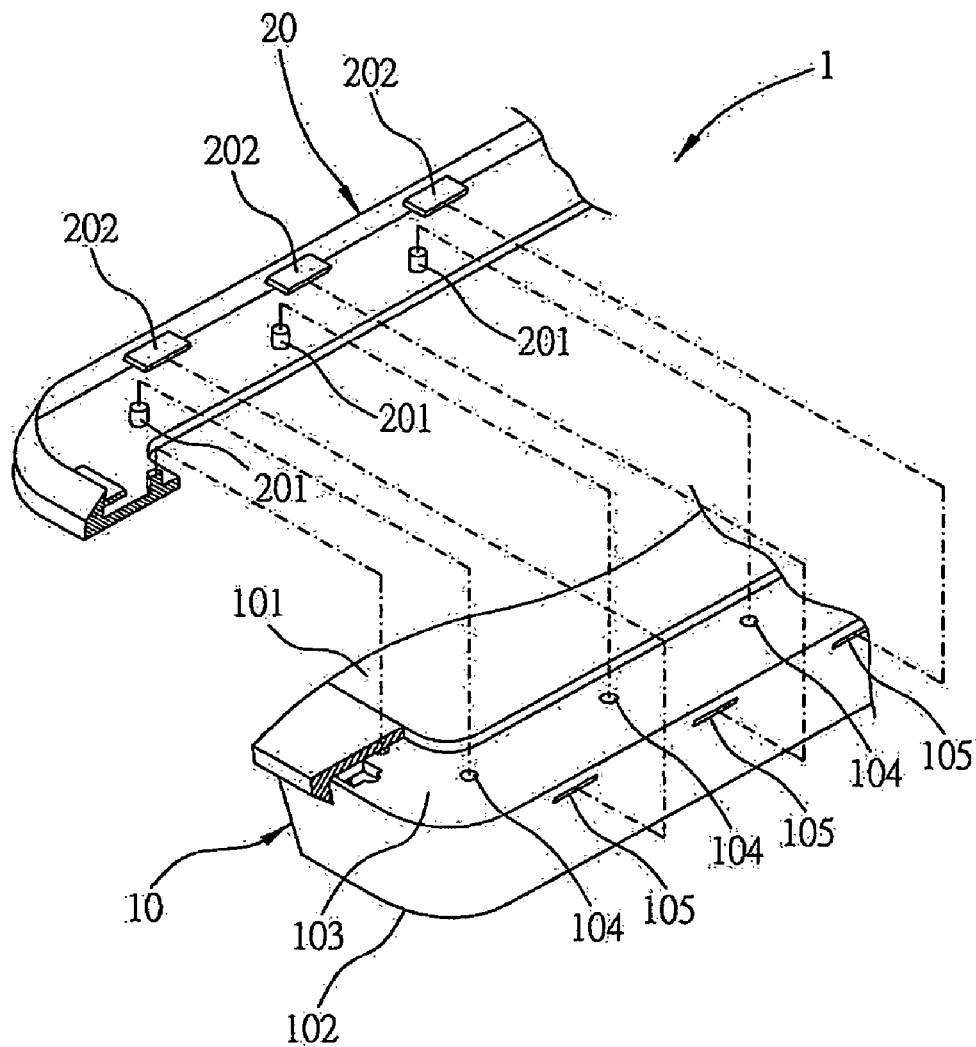
FIG. 1 is a partial perspective view of a case structure for a notebook computer according to a first embodiment of the present invention.

Please referring to FIG. 1, which shows a partial three-dimensional perspective diagram of a case structure 1 of the present invention. The case structure 1 according to a first embodiment of the present invention includes a main body 10 provided with an upper case 101 and a lower case 102 and a side piece 20 provided with a plurality of tenons 201 and hooks 202.

Figure 2:
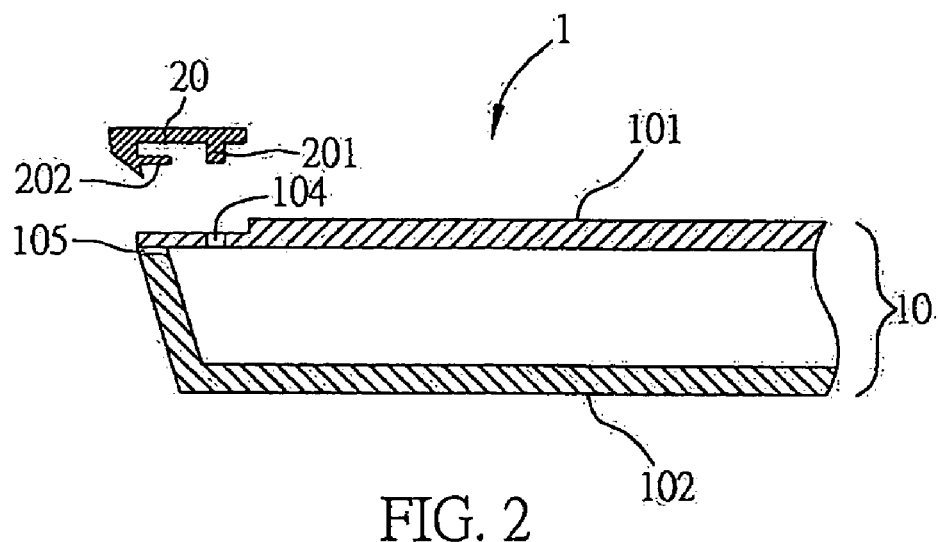
FIG. 2 is a partial cross-sectional view of the case structure of FIG. 1.
Figure 3:
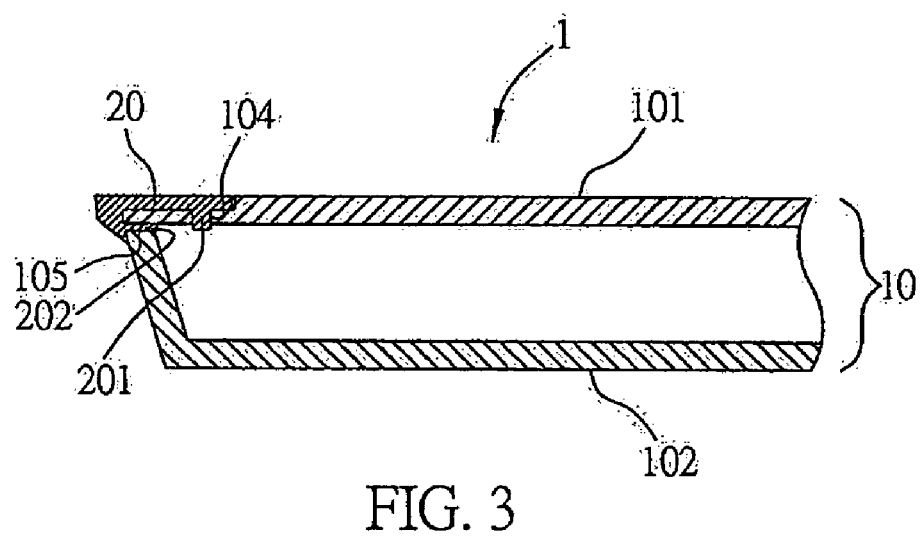
FIG. 3 is a partial cross-sectional view of the case structure having a smaller side piece.

Referring to FIGS. 1 and 2, the upper case 101 is longer than the lower case 102, thereby the cross section of the main body 10 having trapezoid shape. A recess 103 is formed at one side of the upper case 101, which is provided with a plurality of perforations 104 and slots 105 respectively corresponding to the tenons 201 and the hooks 202. For joining the side piece 20 with the main body 10, the tenons 201 are inserted into the perforations 104 and the hooks 202 are engaged with the slots 105. Accordingly, the side piece 20 is stably fixed to one side of the main body 10 and the upper surface of the side piece 20 is flush with the surface of the upper case 101, as shown in FIG. 3. It should be noted that except to the side that functions as a rotation axis, the side piece 20 could be mounted to any other sides of the main body 10 or mounted to at least two sides thereof such that the size of the case structure of the present invention could be varied either in one direction or in bi-direction.

Furthermore, the side piece 20 could be made of Al alloy, metal or plastic material which could be the same as or different from the material composing the main body 10, thereby increasing appearance variability of the case structure of the present invention.

Figure 4:
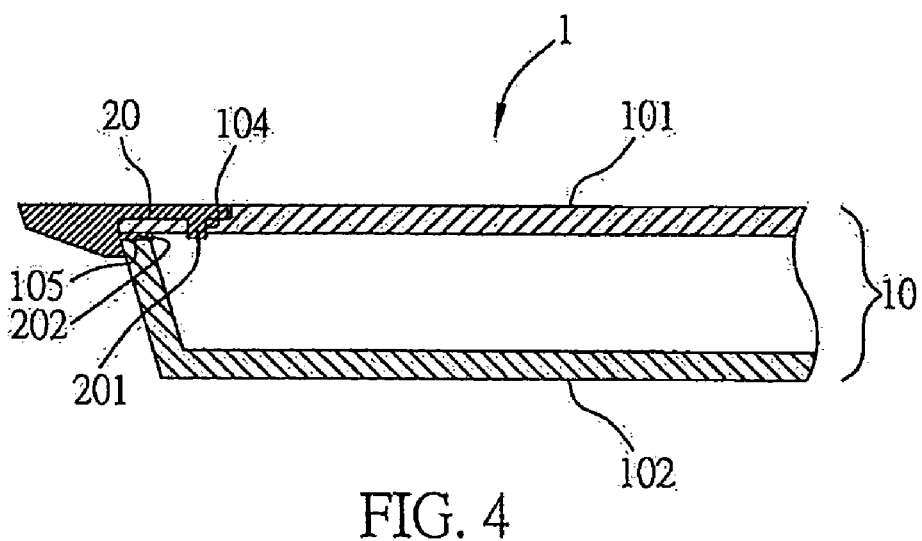
FIG. 4 is a partial cross-sectional view of a case structure having a larger side piece.

When one wishes to change the size of the case structure, only the size of the side piece needs to be changed while the main body can be kept unchanged. As a result, different sizes of the side piece result in different sizes of case structures, thereby eliminating the need for molding and manufacturing of different sized case structures. In order to assist understanding of the present invention, please compare FIGS. 3 and 4. The only difference between these two figures is that the side piece 20 in FIG. 4 is wider than the side piece 20 in FIG. 3. After joining the side piece to the case structure, the resulting case structure including the side piece 20 in FIG. 4 is wider than the case structure including the side piece 20 in FIG. 3.

Figure 5:
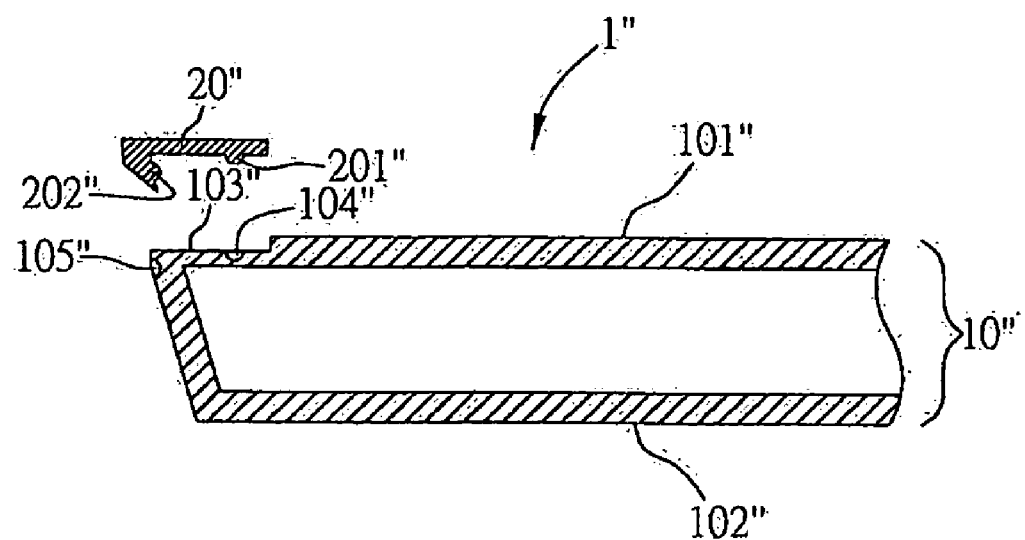
FIG. 5 is a partial cross-sectional view of a case structure for a notebook computer according to a second embodiment of the present invention.

Referring to FIG. 5, which shows a partial cross-sectional diagram of the case structure according to a second embodiment of the present invention, the case structure 1" according to the second embodiment of the present invention is similar to the above case structure 1 according to the first embodiment. The difference between them is that the main body 10" of the case structure 1" is provided with two rail grooves 104", 105" on the recess 103" thereof and correspondingly the side piece 20" is provided with two separate protruding rails 201", 202" to respectively engage the rail grooves 104", 105", thereby stably fixing the side piece 20" to the recess 103" of the main body 10". It should be noted that the arrangement of the rail grooves and the corresponding protruding rails are interchangeable, that is, the protruding rails could be formed on the main body, and correspondingly, the rail grooves could be formed on the side piece. Moreover, a stopper mechanism should be formed to prevent unwanted displacement of the side piece relative to the main body during engagement of the protruding rails and the rail grooves. Such a mechanism is a prior art and detailed description of it is thus omitted.

Figure 6:
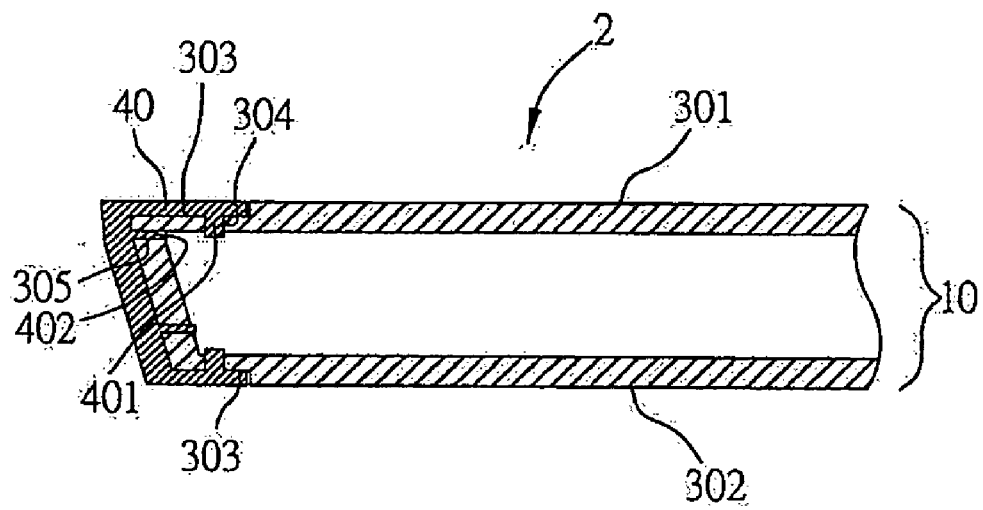
FIG. 6 is a partial cross-sectional view of a case structure for a notebook computer according to a third embodiment of the present invention.

Referring to FIG. 6, which shows a partial cross-sectional diagram of the case structure according to a third embodiment of the present invention, the case structure 2 according to the third embodiment is similar to the case structure 1 according to the first embodiment. The difference between them is that the upper case 301 and the lower case 302 are respectively provided with recesses 303. Correspondingly, a U-shaped side piece 40 is formed to cover the recesses 303 formed on the upper case 301 and the lower case 302. The perforations 304 and slots 305 are formed on the recesses 303 to respectively engage tenons 401 and hooks 402 of the side piece 40, thereby stably fixing the side piece 40 to one side of the main body 30. After the engagement, the upper surface of the side piece 40 is flush with the surface of the upper case 301 and the lower surface of the side piece 40 is flush with the surface of the lower case 302.

Furthermore, in the present embodiment, an expansion connector could be added to the case structure. Correspondingly, an insertion opening should be formed on the side piece through which the expansion device could be connected with the case structure.

The invention has been described using exemplary preferred embodiments. However, it is to be understood that the scope of the invention is not limited to the disclosed embodiments. For example, the side piece could be made of other material besides Al alloy, metal or plastic material and the means for attaching the side piece and the main body is not limited to those described in the embodiments above, as long as the side piece can be stably fixed to the main body. Thus, the present invention is intended to cover various modifications and similar arrangements. The scope of the claims, therefore, should be accorded the broadest interpretation so as to encompass all such modifications and similar arrangements.

What is claimed is:

1. A case structure for an electronic device, at least comprising:
    a main body comprising an upper case and a lower case, wherein recesses are respectively formed at sides of the upper case and the lower case, and a first mounting portion is formed at a predefined position on the recess thereof, and includes at least one perforation and slot; and
    at least one side piece detachably mounted to at least one side of the main body, wherein the side piece is substantially U-shaped to cover the recesses and has a second mounting portion formed corresponding to the first mounting portion and including at least one tenon and hook, an upper surface of the side piece is in the same plane as a surface of the upper case and a lower surface of the side piece is in the same plane as a surface of the lower case after the side piece is joined with the recesses, and the side piece is stably mounted to the main body by engaging the first mounting portion with the second mounting portion.

2. The case structure for an electronic device of claim 1, wherein the size of the upper case is bigger than that of the lower case such that the main body has a trapezoid shaped cross section.

3. The case structure for an electronic device of claim 1, wherein the side of the main body is a side that does not function as a rotation axis.

4. The case structure for an electronic device of claim 1, wherein the side piece is made of one selected from the group consisting of Al alloy, metal and plastic material.

5. A case structure for an electronic device, at least comprising:
    a main body comprising an upper case and a lower case, wherein recesses are respectively formed at sides of the upper case and the lower case, and a first mounting portion is formed at a predefined position on the recess thereof, and includes at least one tenon and hook; and
    at least one side piece detachably mounted to at least one side of the main body, wherein the side piece is substantially U-shaped to cover the recesses and has a second mounting portion formed corresponding to the first mounting portion and including at least one perforation and slot, an upper surface of the side piece is in the same plane as a surface of the upper case and a lower surface of the side piece is in the same plane as a surface of the lower case after the side piece is joined with the recesses, and the side piece is stably mounted to the main body by engaging the first mounting portion with the second mounting portion.

6. A case structure for an electronic device, at least comprising:
    a main body comprising an upper case and a lower case, wherein recesses are respectively formed at sides of the upper case and the lower case, and a first mounting portion is formed at a predefined position on the recess thereof; and
    at least one side piece detachably mounted to at least one side of the main body, wherein the side piece is substantially U-shaped to cover the recesses and has a second mounting portion formed corresponding to the first mounting portion, an upper surface of the side piece is in the same plane as a surface of the upper case and a lower surface of the side piece is in the same plane as a surface of the lower case after the side piece is joined with the recesses, and the side piece is stably mounted to the main body by engaging the first mounting portion with the second mounting portion,
    wherein the first mounting portion includes at least one rail groove disposed on the main body and extending along the longitudinal direction of the recess in order to engage at least one protruding rail disposed on the side piece corresponding to the position of the at least one rail groove.

* * * * *